(12) United States Patent
Ishida et al.

(10) Patent No.: US 8,017,966 B2
(45) Date of Patent: Sep. 13, 2011

(54) LIGHT-EMITTING MODULE OF VEHICULAR LAMP

(75) Inventors: Hiroyuki Ishida, Shizuoka (JP); Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 587 days.

(21) Appl. No.: 11/937,109

(22) Filed: Nov. 8, 2007

(65) Prior Publication Data

US 2008/0111143 A1 May 15, 2008

(30) Foreign Application Priority Data

Nov. 13, 2006 (JP) ................................ 2006-306461

(51) Int. Cl.
*H01L 33/00* (2010.01)
(52) U.S. Cl. .................. 257/99; 257/E33.066
(58) Field of Classification Search .............. 438/22; 257/98–100, E33.062, E33.065
See application file for complete search history.

(56) References Cited

U.S. PATENT DOCUMENTS

| | | | | |
|---|---|---|---|---|
| 3,109,958 A | * | 11/1963 | Delachapelle et al. | 315/74 |
| 6,650,018 B1 | * | 11/2003 | Zhao et al. | 257/775 |
| 6,890,234 B2 | * | 5/2005 | Bortscheller et al. | 445/25 |
| 6,948,836 B2 | * | 9/2005 | Ishida et al. | 362/516 |
| 6,980,234 B2 | * | 12/2005 | Kitawaki | 348/207.1 |
| 7,118,928 B2 | * | 10/2006 | Steckl et al. | 438/22 |
| 7,293,889 B2 | * | 11/2007 | Kamiya et al. | 362/84 |
| 7,422,349 B2 | * | 9/2008 | Wada et al. | 362/373 |
| 2003/0136965 A1 | | 7/2003 | Lee | |
| 2006/0087861 A1 | | 4/2006 | Tessnow et al. | |

FOREIGN PATENT DOCUMENTS

| | | |
|---|---|---|
| JP | 2001-168395 A | 6/2001 |
| JP | 2005-85548 A | 3/2005 |
| JP | 2005085549 A | 3/2005 |
| JP | 2005159178 A | 6/2005 |
| JP | 2006127819 A | 5/2006 |

OTHER PUBLICATIONS

Office Action in Japan Patent Application No. 2006-306461 filed on Dec. 21, 2010 (3 Pages).
English Patent abstract of JP2005159178 from esp@cenet, Published Jun. 16, 2005 (1 Page).
English Patent abstract of JP2005085549 from esp@cenet, Published Mar. 31, 2005 (1 Page).
English Patent abstract of JP2006127819 from esp@cenet, Published May 18, 2006 (1 Page).
English abstract of JP2001168395 published Jun. 22, 2001, esp@cenet database, 1 page.
Notification of the First Office Action issued in Chinese Application No. 200710187804.7 issued on Oct. 10, 2008 and English translation thereof, 10 pages.
English abstract of JP2005085548 published Mar. 31, 2005, esp@cenet database, 1 page.

* cited by examiner

*Primary Examiner* — Matthew W Such
*Assistant Examiner* — Ali Naraghi
(74) *Attorney, Agent, or Firm* — Osha • Liang LLP

(57) ABSTRACT

A light-emitting module includes a semiconductor light-emitting element with a generally oblong shape, and a planar electrode formed on a surface of the semiconductor light-emitting element. The planar electrode has a generally right triangular electrode portion that is defined by an oblique cut-off line on any one of four corners of the semiconductor light-emitting element. The planar electrode is formed with a wire bonding portion that establishes a current-carrying connection with the generally right triangular electrode portion.

3 Claims, 3 Drawing Sheets

LED LIGHT SOURCE
LIGHT-EMITTING PORTION

23 LINEAR ELECTRODE

23 LINEAR ELECTRODE

24 LINEAR ELECTRODE

ID="N" /># LIGHT-EMITTING MODULE OF VEHICULAR LAMP

BACKGROUND OF INVENTION

1. Field of the Invention

The present invention relates to a light-emitting module of a vehicular lamp that uses a semiconductor light-emitting element such as an LED as a light source.

2. Background Art

There are an increasing number of cases in recent years where a vehicular lamp that includes a headlamp is mounted with a semiconductor light-emitting element (LED) that is compact, lightweight, and has excellent light-emitting efficiency (see Patent Document 1 for an example). A light-emitting surface of an LED chip used as the light source normally has a generally oblong shape, and projecting light from such a light source to form a low beam may necessitate using a shade in order to generate a 15° (or 45°) cut-off line. However, using the shade to block light means that a certain quantity of light is wasted.

[Patent Document 1]

Japanese Patent Application Publication No. JP-A-2005-85548, pages 4 to 25, FIG. 7.

SUMMARY OF INVENTION

A conventional light source using a semiconductor light-emitting element is structured such that a bonding portion of a wire for establishing a current-carrying connection is formed at the center of an oblong-shaped semiconductor light-emitting element, and the interior of a light-emitting surface thereof achieves practically uniform light emission. Therefore, if the light source is projected by a projection lens, a light distribution pattern thereof becomes practically uniform (see FIG. 8(a)). Accordingly, if a plurality of light-emitting modules are used to form a light distribution pattern, then there is uneven brightness around the boundaries of the overlapping light distribution patterns projected on the road surface, which leads to the problem of reduced visibility (see FIG. 8(b)).

One or more embodiments of the present invention enable formation of a cutoff line without requiring a shade and reduce unevenness in light distribution.

A light-emitting module of a vehicular lamp according to one or more embodiments of the present invention is a light-emitting module that includes a semiconductor light-emitting element with a generally oblong shape, and a planar electrode formed on a surface of the semiconductor light-emitting element, wherein the planar electrode has a generally right triangular electrode portion that is defined by an oblique cut-off line on any one of four corners of the semiconductor light-emitting element, and is formed with a wire bonding portion that establishes a current-carrying connection with the generally right triangular electrode portion. According to such a structure, the shape of the generally right triangular electrode portion enables the formation of a cut-off line of a light distribution pattern without using a shade. In addition, by providing the generally right triangular electrode portion at any one of the four corners of the light-emitting element and moving the center of light emission from the light-emitting element to the four corners, it is possible to form a light distribution pattern in which the brightness from the four corners, acting as centers of light emission, gradually reduces towards the surrounding area, even when the light distribution pattern is formed using a plurality of light-emitting modules. Therefore, unevenness in light distribution can be reduced.

In one or more embodiments of the present invention, the generally right triangular electrode portion of the planar electrode preferably has an acute angle that is from 15 degrees to 45 degrees. According to such a structure, an excellent cut-off line can be formed on the light distribution pattern.

In one or more embodiments of the present invention, the planar electrode has a linear electrode portion that is within the generally oblong shape of the semiconductor light-emitting element, and which radially extends from a hypotenuse of the generally right triangular electrode portion. According to such a structure, extending the electrode portion makes it possible to adjust brightness.

In one or more embodiments of the present invention, a phosphor layer is preferably formed on a portion of the surface of the semiconductor light-emitting element other than the generally right triangular electrode portion. According to such a structure, an excellent cut-off line can be formed on the light distribution pattern.

According to one or more embodiments of the present invention, the shape of the generally right triangular electrode portion enables the formation of a cut-off line of a light distribution pattern without using a shade. In addition, by providing the generally right triangular electrode portion at any one of the four corners of the light-emitting element and moving the center of light emission from the light-emitting element to the four corners, it is possible to form a light distribution pattern in which the brightness from the four corners, acting as centers of light emission, gradually reduces towards the surrounding area, even when the light distribution pattern is formed using a plurality of light-emitting modules. Therefore, unevenness in light distribution can be reduced.

Other aspects and advantages of the invention will be apparent from the following description and the appended claims.

BRIEF DESCRIPTION OF DRAWINGS

FIGS. 8(a) and 8(b) are explanatory drawings of light distribution patterns from a conventional light source using a

DETAILED DESCRIPTION

Figure 1:
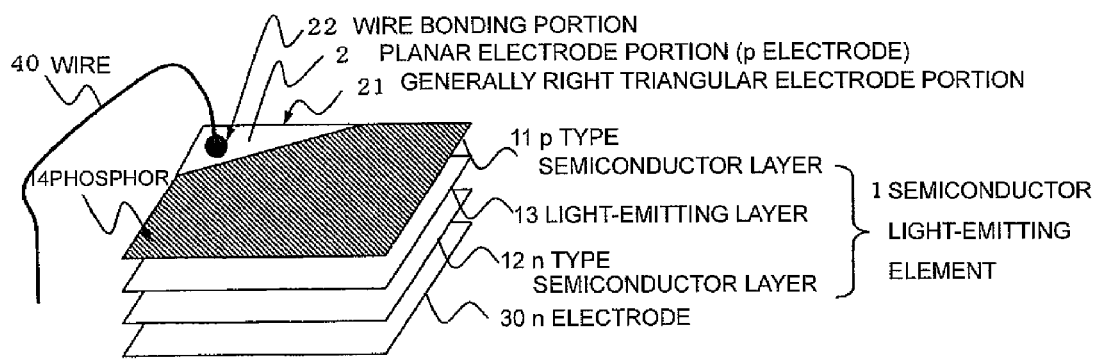
FIG. 1 is a drawing showing the structure of a light-emitting module of a vehicular lamp according to one or more embodiments of the present invention.

FIG. 1 is a drawing showing the structure of a light-emitting module of a vehicular lamp according to one or more embodiments of the present invention. The light-emitting module is mainly structured from a semiconductor light-emitting element 1, and a planar electrode 2 formed on a surface of the semiconductor light-emitting element 1. The semiconductor light-emitting element 1 is an element wherein a p-type semiconductor layer 11 and an n-type semiconductor layer 12 are joined, and includes a light-emitting layer 13 on a bonded interface thereof. The planar electrode 2 is a p-electrode, and has a generally right triangular electrode portion 21 that includes one corner on the oblong-shaped semiconductor light-emitting element 1, as shown in FIG. 1. The generally right triangular electrode portion 21 and a wire 40 are joined and connected to carry current by a wire bonding portion 22 within the planar electrode 2. An n-electrode 30 is formed on a surface opposite the semiconductor light-emitting element 1 as an electrode corresponding to the p-electrode. A phosphor 14 that emits light when excited by light emission from the semiconductor light-emitting element 1 is coated on a surface (an area indicated by hatching in FIG. 1) of the p-type semiconductor layer 11 other than areas where the planar electrode 2 is formed. In other words, light emission from the light-emitting layer 13 of the semiconductor light-emitting element 1 results in excitation of and light emission from the phosphor 14, whereby the light-emitting module radiates light.

Figure 2:
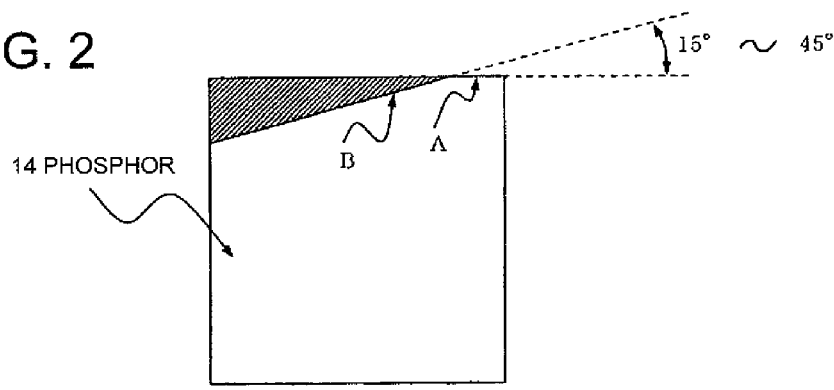
FIG. 2 is a drawing showing the shape of a light-emitting surface of the light-emitting module according to one or more embodiments of the present invention.

FIG. 2 is a drawing showing the shape of a light-emitting surface of the light-emitting module according to one or more embodiments of the present invention. The phosphor 14 is coated on an area other than the planar electrode portion 2, as indicated by hatching in the figure, and this portion emits light. The electrode is formed such that an acute angle of the right triangle is from 15° to 45°. A cut-off line during light irradiation is formed from a side indicated by A (side A) and a side indicated by B (side B: the hypotenuse of the generally right triangular electrode portion 21) of the light-emitting surface. The cut-off line of the light distribution pattern will be described in more detail later.

Figure 3:
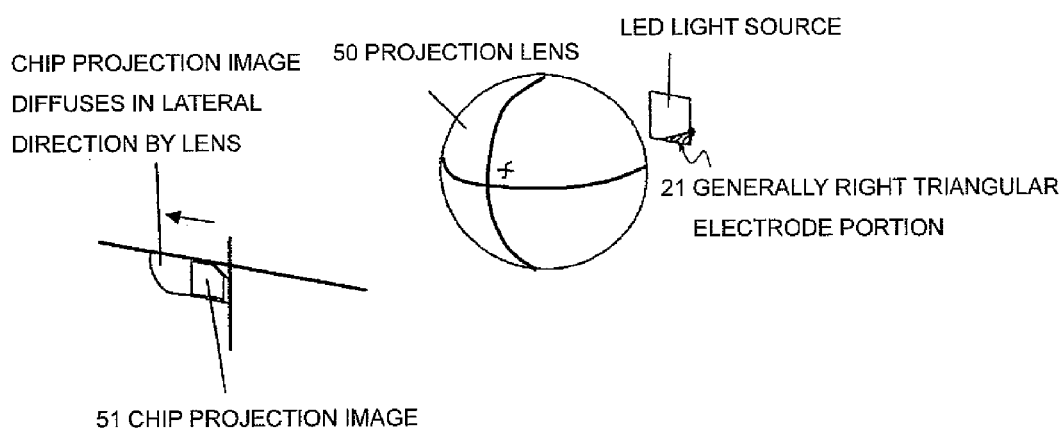
FIG. 3 is a drawing showing how a lamp using the light-emitting module radiates light according to one or more embodiments of the present invention.

FIG. 3 is a drawing showing how a lamp using the light-emitting module radiates light according to one or more embodiments of the present invention. As FIG. 3 shows, when mounted in a vehicle, the light-emitting module according to one or more embodiments of the present invention is disposed in proximity to a focal point of a projection lens 50 such that the light-emitting surface of the semiconductor light-emitting element 1 faces the projection lens 50, and such that the generally right triangular electrode portion 21 is disposed towards the bottom. The projection image of the semiconductor light-emitting element 1 from the projection lens 50 is set to a position as indicated by reference numeral 51 in the figure, and a light distribution pattern is formed by the projection lens 50 in which the projection image 51 diffuses in the lateral direction.

Figure 4:
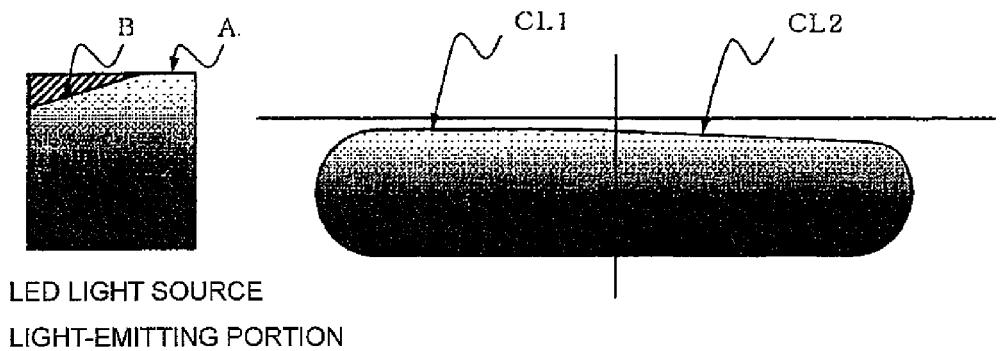
FIG. 4 is a drawing showing a light distribution pattern formed by the lamp mounted with the light-emitting module according to one or more embodiments of the present invention.

FIG. 4 is a drawing showing a light distribution pattern formed by the lamp mounted with the light-emitting module according to one or more embodiments of the present invention. Sides A and B on the light-emitting surface of the semiconductor light-emitting element 1 respectively form cut-off lines CL1 and CL2. Reference numeral CL1 denotes a so-called horizontal cut-off line that is formed by the side A of the semiconductor light-emitting element 1. Reference numeral CL2 denotes a so-called 15° cut-off line that is formed by a line with an inclination of 15° (i.e., side B), which is created by the light-emitting surface of the semiconductor light-emitting element 1 due to the shape of the planar electrode 2. It should also be noted that if the line has an inclination of 45°, then a 45° cut-off line will be formed.

As shown by the light distribution pattern of FIG. 4, the distribution of brightness (illumination) within the light distribution pattern is highest in proximity to the cut-off line and gradually reduces downward (closer to the road surface). This is due to the luminance increasing closer to the electrode, and can be achieved by giving the planar electrode a shape and arrangement as described above. In other words, with the light-emitting module according to one or more embodiments of the present invention, it is possible to use one module to provide a natural and appropriate luminance gradient to a light distribution pattern.

Figure 5:
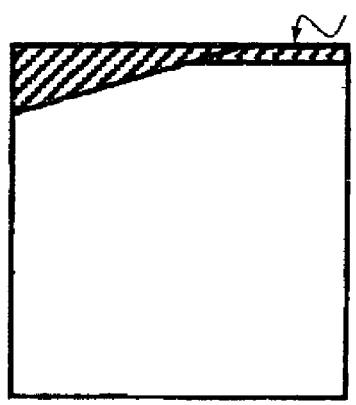
FIG. 5 is a drawing showing an example of a modified shape for the planar electrode, in which one linear electrode has been added, of the light-emitting module according to one or more embodiments of the present invention.
Figure 6:
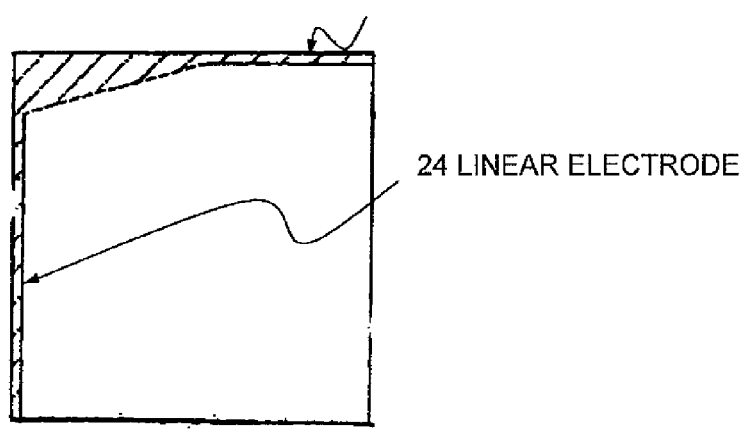
FIG. 6 is a drawing showing an example of a modified shape for the planar electrode, in which two linear electrodes have been added, of the light-emitting module according to one or more embodiments of the present invention.
Figure 7:
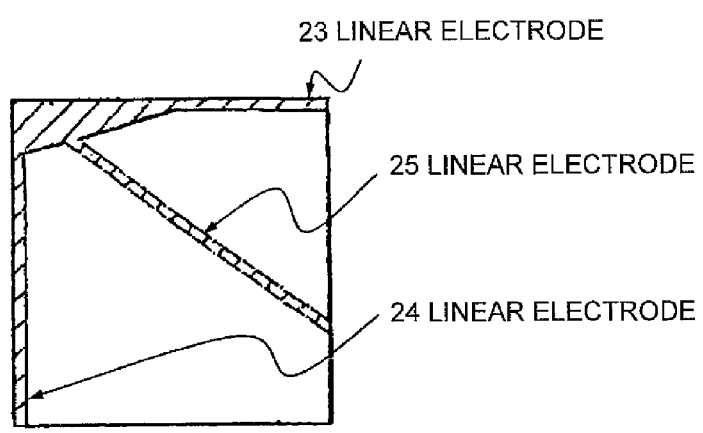
FIG. 7 is a drawing showing an example of a modified shape for the planar electrode, in which three linear electrodes have been added, of the light-emitting module according to one or more embodiments of the present invention.
Figures 8A, 8B:
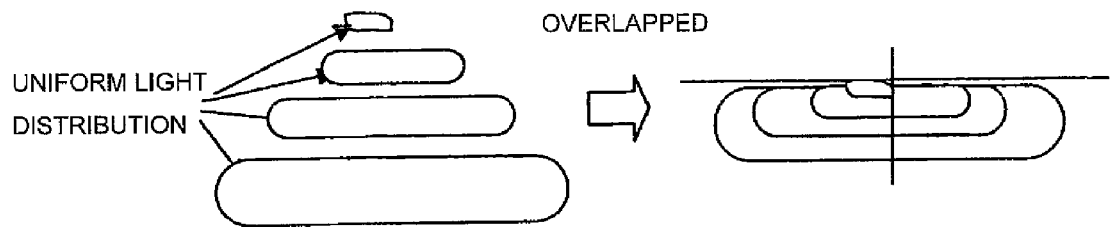

FIGS. 5, 6, and 7 are drawings showing examples of a modified shape for the planar electrode of the light-emitting module according to one or more embodiments of the present invention. As the figures show, structures are achieved where, in addition to the generally right triangular electrode portion 21, linear electrode portions 23, 24, and 25 that radially extend therefrom are added. An increased number of linear electrodes results in a shorter distance between electrodes. Therefore, the luminance gradient can be moderated and the illumination distribution less focused (more specifically, the difference in luminance between the front of the vehicle and on the road surface can be reduced).

The appropriate and necessary light distribution pattern varies depending on the weather, road surface, and other conditions during travel. It is possible to achieve illumination using a suitable and optimal light distribution pattern, however, with the use of a vehicular lamp that is provided with a plurality of lamp units mounted with light-emitting modules, each having a planar electrode with a different shape.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS

1 Semiconductor Light-Emitting Element
2 Planar Electrode Portion
11 P-Type Semiconductor Layer
12 N-Type Semiconductor Layer
13 Light-Emitting Layer
14 Phosphor
21 Generally Right Triangular Electrode Portion
22 Wire Bonding Portion
23,24,25 Linear Electrode
30 N-Electrode
40 Wire
50 Projection Lens
51 Semiconductor Light-Emitting Element Projection Image
Cl1 Horizontal Cut-Off Line
Cl2 15° Cut-Off Line

What is claimed is:
1. A vehicular lamp comprising:
a light-emitting module comprising:

a semiconductor light-emitting element with a generally oblong shape having a length and a width, and having a thickness substantially less than the length and the width, and a planar electrode formed on a surface of the semiconductor light-emitting element, wherein the planar electrode is a p-type electrode, and the semiconductor light-emitting element further comprises a n-type electrode formed below and overlapping the p-type electrode in a thickness direction, wherein the planar electrode has a generally right triangular electrode portion that is defined by an oblique cut-off line on any one of four corners of the semiconductor light-emitting element, wherein the planar electrode is formed with a wire bonding portion that establishes a current-carrying connection with the generally right triangular electrode portion, and wherein a phosphor layer is formed on a portion of the surface of the semiconductor light-emitting element other than the generally right triangular electrode portion; and a lens that projects and diffuses light from the light-emitting module, wherein the lens projects and diffuses the oblique cut-off line to form an oblique light distribution cut-off line on a light distribution pattern of the vehicular lamp.

2. The vehicular lamp according to claim 1, wherein the generally right triangular electrode portion of the planar electrode has an acute angle that is from 15 degrees to 45 degrees.

3. The vehicular lamp according to claim 1, wherein the planar electrode has a linear electrode portion that is within the generally oblong shape of the semiconductor light-emitting element, and radially extends from a hypotenuse of the generally right triangular electrode portion.

\* \* \* \* \*